United States Patent [19]

Hagiwara et al.

[11] Patent Number: 4,514,830
[45] Date of Patent: Apr. 30, 1985

[54] DEFECT-REMEDIABLE SEMICONDUCTOR INTEGRATED CIRCUIT MEMORY AND SPARE SUBSTITUTION METHOD IN THE SAME

[75] Inventors: Takaaki Hagiwara, Kodaira; Masatada Horiuchi, Koganei; Ryuji Kondo, Kodaira; Yuji Yatsuda, Kanagawa; Shinichi Minami, Hachioji, all of Japan

[73] Assignee: Hitachi, Ltd., Tokyo, Japan

[21] Appl. No.: 344,974

[22] Filed: Feb. 2, 1982

[30] Foreign Application Priority Data

Feb. 6, 1981 [JP] Japan .................. 56-15742

[51] Int. Cl.³ .......................... G11C 11/40
[52] U.S. Cl. ..................... 365/200; 365/210
[58] Field of Search ............ 365/200, 210; 371/10

[56] References Cited

U.S. PATENT DOCUMENTS 4,358,833  11/1982  Folmsbee et al. ............ 365/200
4,422,161  12/1983  Kressel et al. ............... 365/200

OTHER PUBLICATIONS

Steiner, "Module Level Redundancy", IBM Tech. Disc. Bul., vol. 20, No. 7, 12/77, pp. 2594–2595.
Fitzgerald et al., "Semiconductor Memory Redundancy at the Module Level", IBM Tech. Disc. Bul., vol. 23, No. 8, 1/81, pp. 3601–3602.

Primary Examiner—Terrell W. Fears
Attorney, Agent, or Firm—Antonelli, Terry & Wands

[57] ABSTRACT

An LSI memory comprises a memory array including usual memory cells arranged in a matrix form, usual address transistors for selecting usual lines connected to the columns or rows of the memory array, address lines for controlling the usual address transistors, spare memory cells provided in the memory array, a spare line connected to the spare memory cells, spare address transistors connected between the address lines and the spare lines, and nonvolatile memory elements connected between the sources of the spare address transistors and the ground. By putting any one of the nonvolatile memory elements into the written state, any one of the spare address transistors are conditioned into an active state so that the spare line can be substituted for a defective usual line.

15 Claims, 8 Drawing Figures

DEFECT-REMEDIABLE SEMICONDUCTOR INTEGRATED CIRCUIT MEMORY AND SPARE SUBSTITUTION METHOD IN THE SAME

The present invention relates generally to a remedy for defects in a semiconductor integrated circuit memory (LSI memory), namely, the substitution of spare elements for defective elements incorporated in the LSI memory, and more particularly to a defect-remediable LSI memory which can be remedied even if the memory includes defective elements and a method for substituting spare elements for the defective elements in such a memory.

Conventional defect remeding techniques in LSI memories with defect-remediable provisions include a first method in which a conductor made of metal, polycrystalline silicon or the like is fused and cut open by means of laser beam, a second method in which such a conductor is fused by means of laser beam to form a necessary short-circuit, a third method in which a fuse portion made of polycrystalline silicon or the like is melt and cut open by passing a large current therethrough, and a fourth method in which a necessary short-circuit is formed by passing a large current through a high-resistance conductor.

The first and second methods require a special processing machine because of the use of a laser beam. Further, these methods involve a troublesome and time-consuming alignment of a laser beam with respect to a portion to be processed on the chip. In this way, these methods using a laser beam have a disadvantage that it takes much time and cost to test and remedy the chip.

On the other hand, though the third and fourth methods using an electrical processing have advantages that an ordinary tester can be used and the processing time can be shortened, they need probing pads on the periphery of the chip for supplying a cutting or short-circuiting current, which requires an inevitable increase in the chip area or size. In order to avoid this, it has been proposed to place each probing pad over an active region through an insulating film. However, the application of this method is restrictive since the provision of such probing pads will reduce the reliability of the chip and the number of the pads must be increased with the increase in the memory capacity.

An object of the present invention is to provide a defect remeding technique in which a remedy for defects in an LSI memory can be electrically made in a short time without needing additional or excess pads.

In accordance with the present invention, nonvolatile semiconductor memory elements are used as remedy means for defects and are incorporated in an LSI memory circuit. If an address for a defective bit is externally inputted, elements to be processed in the chip can be automatically selected and the defective bit and a spare bit are readily conditioned into inactive and active states, respectively.

Embodiments of the present invention will now be described in conjunction with the accompanying drawings, in which.

Some preferred embodiments of the present invention will now be explained.

EMBODIMENT 1

Nonvolatile semiconductor memory elements are typically classified into three types, that is, MNOS, FAMOS and FLOTOX types. In realizing the present invention, any of these types can be used. However, since the FLOTOX type can be most conveniently used in the present invention, explanation will be first made of the FLOTOX type nonvolatile memory element.

For FLOTOX type nonvolatile memory elements, one can refer to "16-K EE-PROM relies on tunneling for byte-erasable program storage", Electronics, Feb. 28, 1980, pp. 113–117.

Figure 1:
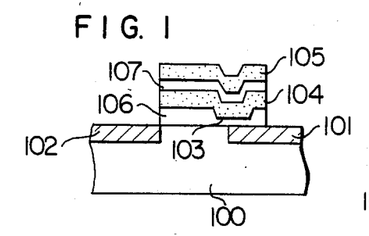
FIG. 1 shows in cross section the structure of an FLOTOX type nonvolatile memory element which can be preferably used in the present invention.
Figure 2:
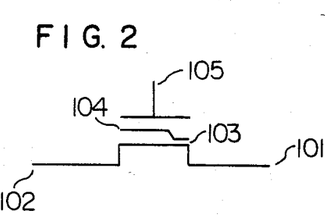
FIG. 2 is a symbolic representation of the FLOTOX type memory element of FIG. 1.

Referring to FIG. 1 showing the structure of an FLOTOX type nonvolatile memory element, reference numerals 100, 101 and 102 represents a semiconductor body or substrate, a drain and a source region, respectively. Though this element is analogous to a FAMOS type element, it has a thin tunnel oxide film 103 of about 5 to 20 nm thickness on the drain region 101 or in the vicinity thereof, a two-level structure of polycrystalline silicon gates 104 and 105, and insulating films 106 and 107. FIG. 2 shows a symbolic representation of the element of FIG. 1. For a writing operation of the element, a high voltage (for example, +15 V) is applied to the control gate 105 with the drain 101 teing grounded. On the other hand, for an erasing operation, a high voltage is applied to the drain 101 with the gate 105 being grounded. In either operation, a tunnel current will flow through the thin oxide film 103 in the same direction as the voltage application so that charges are correspondingly stored in the floating gate 104. As a result, if the element is of n-channel type, the gate 104 will have a positive threshold voltage after the writing operation and a negative threshold voltage after the erasing operation. A feature of this type of element is that the current necessary for the writing or erasing operation is very small (about $10^{-9}$ A) though the conventional remeding method using polycrystalline silicon fuses requires a fuse cutting current larger than $10^{-3}$ A. Therefore, the use of the FLOTOX type elements facilitates an automatic selection of elements to be processed in a chip, as compared with the fuse cutting method.

Figure 3:
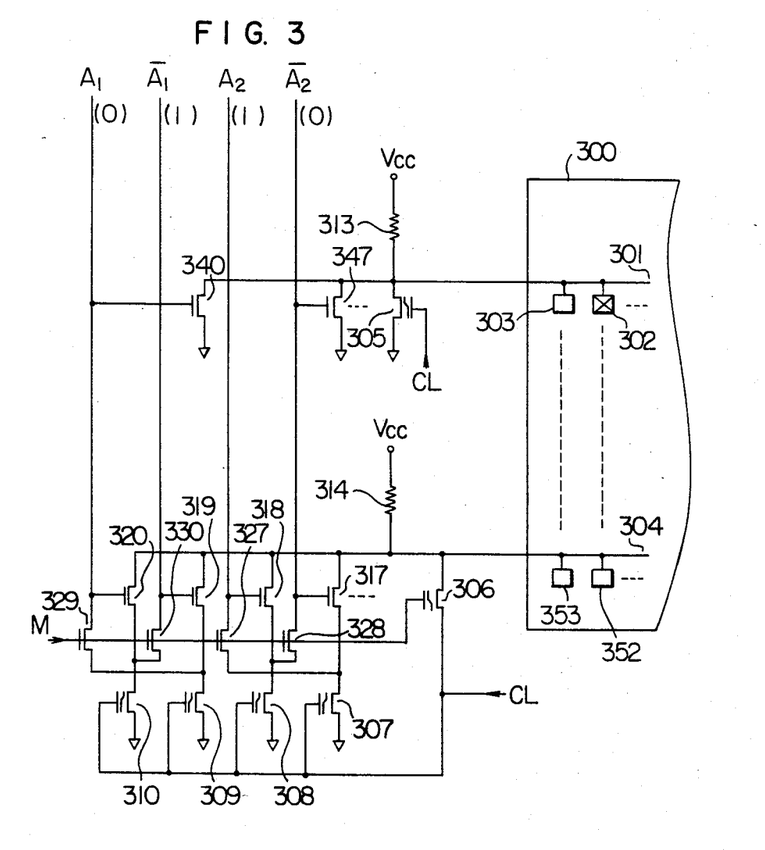
FIG. 3 shows the circuit diagram of an LSI memory according to a first embodiment of the present invention in which FLOTOX type nonvolatile memory elements are used.

FIG. 3 shows the circuit diagram of an LSI memory according to a first embodiment of the present invention. In the present embodiment, n-channel elements are employed. In the figure, numeral 300 denotes an array of usual memory cells 302, 303, etc. and spare memory cells 352, 353, etc. arranged in a matrix form of columns and rows. A usual address circuit including MOS transistors 340 and 347 is connected between address lines and a usual word (or column select) line 301 while a spare address circuit including MOS transistors 317 to 320 is connected between the address lines and a spare word (or column select) line 304. Numerals 305, 306 and 310 represent FLOTOX type nonvolatile memory elements. For a remedy for defects, the elements 307 to 310 connected to the spare address circuit, the element 306 connected to the spare word line 304, and the element 305 connected to the usual word line 301 serve as first, second and third converting circuits, respectively. Numerals 313 and 314 represent load elements of MOS structure functioning as resistors.

Now consider that the cells or bits 303 are normal and the bit 302 labelled symbol X in FIG. 3 is defective. In this embodiment, the nonvolatile memory elements 305, 306 and 307 to 310 are used so that the word line 301 including the defective bit is rendered inactive and the spare word line 304 is conditioned into an active state. It should be noted that though word lines 301 are provided corresponding to the desired number of matrix columns, only one of the word lines 301 is illustrated for the purpose of simplicity in FIG. 3. Similarly, several or several tens of spare word lines 304 may be usually provided, but only one thereof is illustrated in the figure. Only two bits ($A_1$ and $A_2$) of an address signal are shown and the subsequent bits ($A_3, A_4 \ldots$) followed are omitted.

The substitution programming procedure for a remedy for defects is as follows. First, a defective bit or bits are searched by the usual wafer probing method. If the number of the defective bits is only one or a plurality of defective bits are on one word line, the word line including the defective bit or bits is replaced by the spare word line. However, before the wafer probing test, a clear signal CL is applied for putting the nonvolatile memory elements 305 and 307 to 310 into the written states ($V_{th} > 0$) and the nonvolatile memory element 306 into the erased state ($V_{th} < 0$). In this connection, the clear signal CL can be given by applying a high voltage to any pin (preferably, a chip select pin ($\overline{CE}$ pin)) other than a supply voltage input pin $V_{cc}$, assuming that the writing or erasing voltage for the FLOTOX type nonvolatile memory element is much greater than the supply voltage. (Since the supply voltage is normally 5 volts, problems will not occur.) That is, if $\overline{CE}$ is higher than 10 V, the clear signal CL is set to be equal to $\overline{CE}$ and if not, the CL is set to a ground level. The above step is carried out for allowing the usual wafer probing by rendering the spare word line 304 inoperative and all the remaining word lines operative.

Next, a substitution programming pulse is externally supplied while the defective word line is accessed. In this case, the supply voltage input pin $V_{cc}$ can be most preferably used for supplying the substitution programming pulse. In other words, when the circuit as shown in FIG. 3 is used, the substitution programming can be accomplished in a very short time only by raising the supply voltage $V_{cc}$ to a high level (for example, $>10$ V). A signal M to be supplied to the gates of control MOS transistors 327 to 330 and the nonvolatile memory element 306 is set as follows.

$M = V_{cc}$ (when $V_{cc} \geq 10$ V)

$M$ = ground level (when $V_{cc} < 10$ V)

It will be understood that the signals M and CL can be readily generated within the chip.

The principle of the above substitution programming will be further detailed. Considering that an address for the defective word line 301 is represented by $A_1 = 0$ and $A_2 = 1$, this address signal is applied to the address lines through address input pins. In this state, when the supply voltage is raised to a high level, the defective word line 301 is selected by the address MOS transistors 340 and 347 so that the supply voltage is in turn applied to the drain of the nonvolatile memory element 305, thereby erasing the element 305. As a result, the erased element 305 is rendered conductive and hence the defective word line 301 is always conditioned to the grounded state or rendered inactive. The raise of the supply voltage to the high level also results in that the lines $A_1$ and $\overline{A_2}$ are at ground level and the lines $\overline{A_1}$ and $A_2$ are at the supply voltage level. Accordingly, the nonvolatile memory elements 307 and 310 are erased while the nonvolatile memory elements 308 and 309 keep their written states. Consequently, the spare address MOS transistors 318 and 319 connected respectively in series with the nonvolatile memory elements 308 and 309 in the written states are put into inactive states while the spare address MOS transistors 317 and 320 connected to the erased nonvolatile memory elements 307 and 310 are put into active states. This means that the spare word line 304 has the same address as the word line 301 before the substitution programming. Further, because the signal CL is at a ground level and the signal M is at a high level, the nonvolatile memory element 306 is put into the written state and hence the non-conductive state, thereby conditioning the word line 304 into an active state. In this way, the substitution programming is completed.

EMBODIMENT 2

Figure 4:
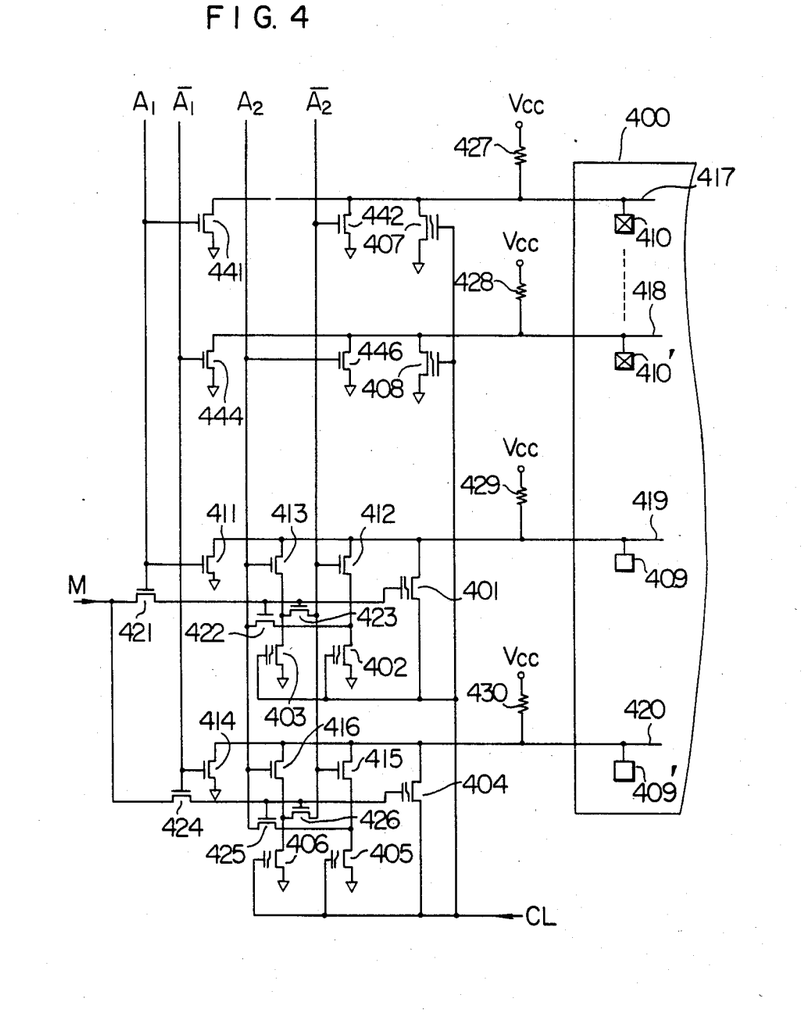
FIG. 4 shows the circuit diagram of an LSI memory according to a second embodiment of the present invention in which two spare word lines are provided.

The first embodiment of the present invention has been explained in connection with FIG. 3, but it will be readily appreciated that other various embodiments can be contemplated. For example, two or more spare word lines may be easily provided. FIG. 4 shows a second embodiment of the present invention wherein two spare word lines are provided and n-channel elements are employed. In the shown example, two word lines 419 and 420 are used as spare word lines, corresponding to respective halves of a memory matrix 400 which correspond to the word accessed when $A_1 = 0$ and the word accessed when $A_1 = 1$. With a usual word line 417 including usual memory cells 410 are associated usual address MOS transistors 441 and 442 and a nonvolatile memory element 407. With a usual word line 418 including usual memory cells 410' are associated usual address MOS transistors 444 and 446 and a nonvolatile memory element 408. With the spare word line 419 including spare memory cells 409 are associated spare address MOS transistors 411 to 413, nonvolatile memory elements 401 to 403 and control MOS transistors 421 to 423. With the spare word line 420 including spare memory cells 409' are associated spare address MOS transistors 414 to 416, nonvolatile memory elements 404 to 406 and control MOS transistors 414 to 416. The elements are of FLOTOX type. Numerals 427 to 430 represent load elements of MOS structure. For example, if the shown bit or cell 410 connected to the word line 417 is defective, the supply voltage $V_{cc}$ is raised to a high level while the word line 417 is accessed, so that similarly to the first embodiment the word line 417 is rendered inactive and the spare word line 419 is conditioned into an active state. The same is true for the word line 418. If the word lines 417 and 418 are both defective, substitution programming is applied to the both lines.

EMBODIMENT 3

Figure 5:
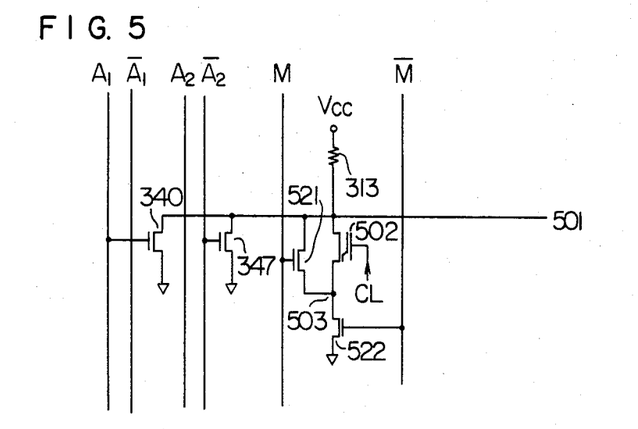
FIG. 5 shows the circuit diagram of an improved usual word line portion for explaining a third embodiment of the present invention.

FIG. 5 illustrates a third embodiment of the present invention as an improvement of the embodiment shown in FIG. 3 for providing a high reliability in conjunction with a usual word line portion. FIG. 5 shows the improved usual word line portion. In the circuit shown in FIG. 3, for a word line including no defects, the memory with the nonvolatile memory 305 kept at the written state is serviceable as a product. Under the practical use of the memory, each time said word line is addressed, the supply voltage (usually, 5 V) is applied to the drain of the nonvolatile memory element 305. Since the applied voltage is much lower than the writing or erasing voltage, for the nonvolatile memory element, no trouble will occur. But, there is a possibility that the nonvolatile memory element may be erased after its use for a long period of time. In order to eliminate this, the embodiment shown in FIG. 5 uses control MOS transistors 521 and 522 applied with signals M and $\overline{M}$, respectively. The substitution programming procedure is carried out in a similar manner to that explained with respect to FIG. 3. A usual water probing is made to search a defective bit while a clear signal CL is applied to the gate of an FLOTOX type nonvolatile memory element 502 to put it into the written state. If the shown word line 501 is defective, the supply voltage $V_{cc}$ is raised to a high level while accessing the line 501, so that the nonvolatile memory element 502 is erased to render the line 501 inactive.

Since the signal M is normally at a ground level and thus the signal $\overline{M}$ is at a high level (usually 5 V corresponding to the supply voltage), the drain of the nonvolatile memory element 502 is always grounded. Therefore, the drain of the element 502 is never subject to any voltage under a normal use of the memory and hence the written element 502 is never erased, which improves the reliability of the memory.

EMBODIMENT 4

Figure 6:
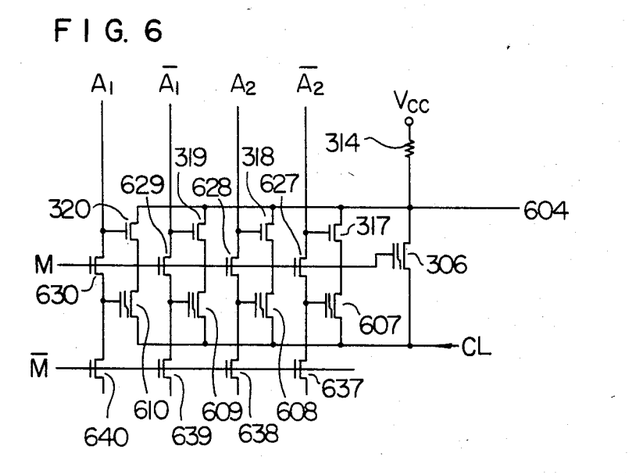
FIG. 6 shows the circuit diagram of an improved spare word line portion for explaining a fourth embodiment of the present invention.

FIG. 6 illustrates a fourth embodiment of the present invention as another improvement of the embodiment shown in FIG. 3 for providing a high reliability in conjunction with a spare word line portion. FIG. 6 shows the improved spare word line portion. At the initial stage of the substitution programming procedure, a clear signal CL is supplied in order to erase all FLOTOX type nonvolatile memory elements 306 and 607–610 included therein. When the supply voltage $V_{cc}$ is raised while a defective word line is accessed, the signal M applied to the gates of control MOS transistors 627 to 630 will go to a high level so that the address signal is applied directly to the gates of the nonvolatile memory elements 607 to 610 and hence writing is made thereto by the high-level signal. At the same time, writing is made to the nonvolatile memory element 306 whose gate is applied with the signal M. As a result, a spare word line 604 is conditioned into an active state and substituted for the defective word line. Under the normal use of the memory, the signal CL always takes a ground level and the gates of the nonvolatile memory elements 607 to 610 are always grounded by control MOS transistors 637 to 640 applied with the signal $\overline{M}$. Therefore, there never occurs a danger that writing or erasing may be made to the nonvolatile memory elements during the normal use of the memory.

EMBODIMENT 5

Figure 7:
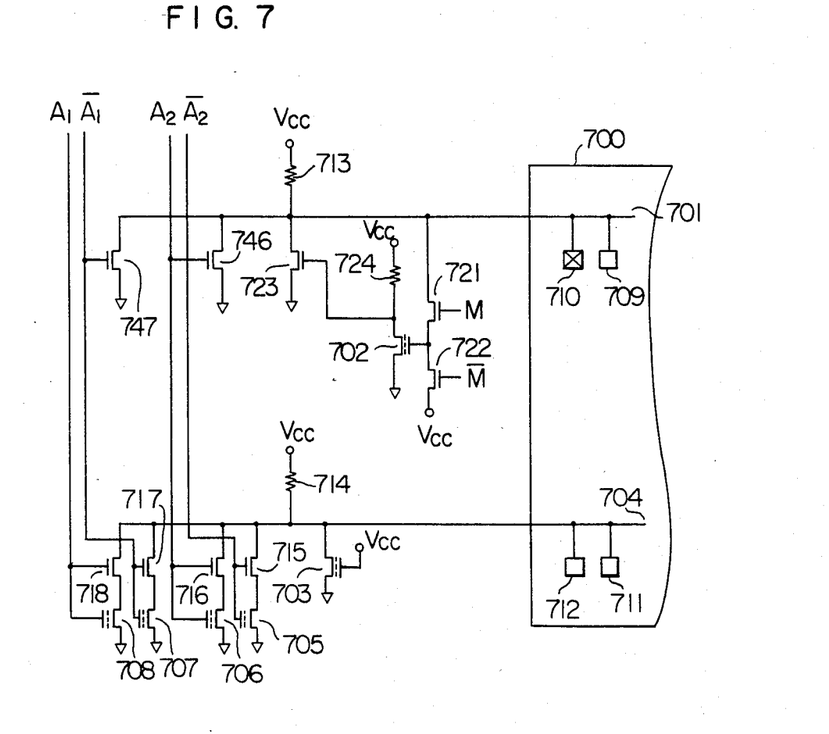
FIG. 7 shows the circuit diagram of an LSI memory according to a fifth embodiment of the present invention in which FAMOS type nonvolatile memory elements are used.

FIG. 7 shows the circuit diagram of an LSI memory according to a fifth embodiment of the present invention, in which FAMOS type nonvolatile memory elements (n-channel) are employed. A FAMOS element of n-channel usually has a threshold voltage of about 1 V, but simultaneous application of high voltages of 20 and 12 V respectively to the gate and drain of the element results in the written state of the element, thereby increasing the threshold voltage up to about 10 V (see P. J. Salsbury: ISSCC Digest of Technical Papers, p. 186).

In the circuit shown in FIG. 7, prior to a wafer probing test, the signal M applied to the gate of an MOS transistor 721 is ground level and the signal $\overline{M}$ applied to the gate of an MOS transistor 722 is set to be equal to the supply voltage (about 5 V). At this time, FAMOS elements 702 and 703 are turned on so that a usual word line 701 including usual memory cells 709, 710, etc. is rendered operative while a spare word line 704 including spare memory cells 711, 712, etc. is rendered inoperative, thereby allowing the wafer probing test.

If the word line 701 is found defective as the results of test (in FIG. 7, the shown cell 710 is a defective bit), the supply voltage $V_{cc}$ is raised to a high level (over 20 V) while the defective bit (in the figure, $A_1$="1" and $A_2$="0") is accessed. At the same time, the signal M is set to be a high level and the signal $\overline{M}$ is grounded. Thus, the high voltages are applied to the gates and drains of the FAMOS elements 702 and 703 to put the elements into the written states so that their threshold voltages increase up to about 10 V. At this time, since the address signal bits $A_1$ and $\overline{A}_2$ are at a high level and the address signal bits $\overline{A}_1$ and $A_2$ are at a ground level, FAMOS elements 705 and 708 are put into the written states and each thereof has a threshold voltage of about 10 V, but FAMOS elements 706 and 707 are not written and each thereof has still a threshold voltage of about 1 V. Thereafter or under the normal use of the memory, when $V_{cc}$ is returned to a usual level (5 V) while M is grounded and $\overline{M}$ is set to be 5 V, the FAMOS elements 702, 703, 705 and 708 are turned off and the elements 706 and 707 are turned on so that an MOS transistor 723 always keeps turned on while 716 and 717 of spare address transistors 715 to 718 are rendered operative, which results in the word line 701 being conditioned into an inactive state and the word line 704 being conditioned into an active state. That is, usual address MOS transistors 746 and 747 are replaced by the spare address transistors 716 and 717 and the defective usual word line 701 is replaced by the spare word line 704.

EMBODIMENT 6

Figure 8:
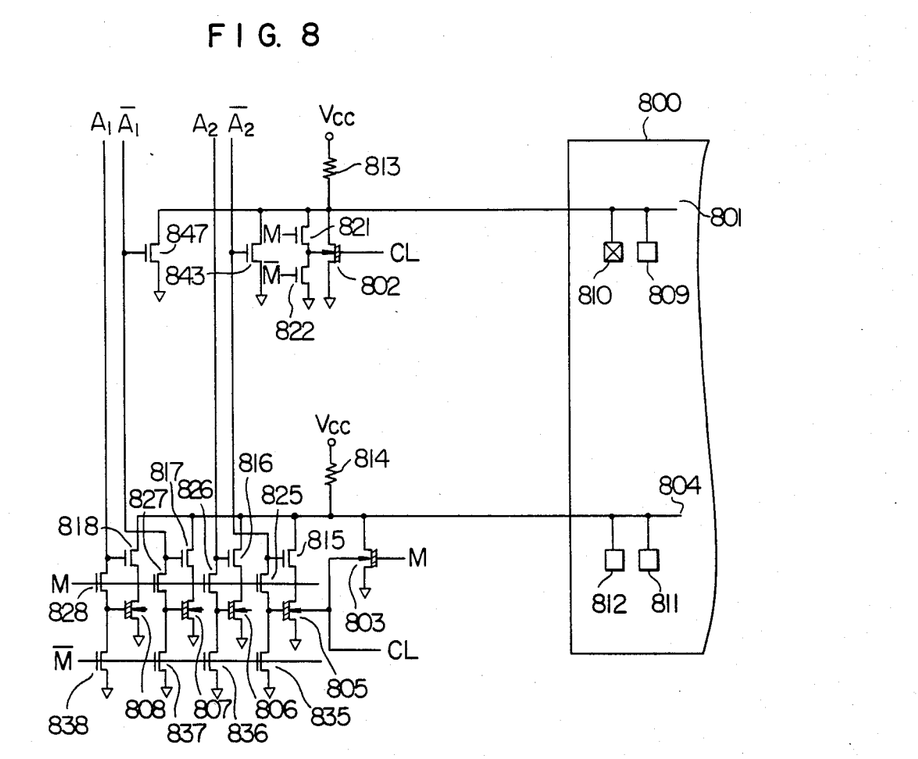
FIG. 8 shows the circuit diagram of an LSI memory according to a sixth embodiment of the present invention in which MNOS type nonvolatile memory elements are used.

FIG. 8 shows the circuit diagram of an LSI memory according to a sixth embodiment of the present invention, in which MNOS type nonvolatile memory elements (n-channel) are used. The writing and erasing to an MNOS element can be realized by the provision of a well structure thereof (see T. Hagiwara: IEEE J. Solid State Circuits, Vol. SC-15, 1980, p. 346). More especially, the writing is proformed by applying a high voltage (about 25 V) to the gate of the element and the erasing is effected by applying a high voltage to the well of the element. The element has a threshold voltage of about 2 V after the writing operation and about −4 V after the erasing operation.

In the circuit shown in FIG. 8, prior to a wafer probing test, a clear signal CL is supplied for putting an MNOS element 802 into the written state while putting MNOS elements 803 and 805 to 808 into the erased state. Thus, a usual word line 801 including usual memory cells 809, 810, etc. is rendered operative while a spare word line 804 including spare memory cells 811, 812, etc. is rendered inoperative, thereby allowing the wafer probing test.

If the word line 801 is found defective (the shown cell 810 is a defective bit) as the results of test, $V_{cc}$ is raised to a high level (for example, over 25 V) while the defective bit is accessed. At the same time, M applied to the gates of control MOS transistors 825 to 828 is set to be a high level and $\overline{M}$ applied to the gates of control MOS transistors 835 to 838 is set to a ground level. As a result, a high voltage is applied to the well of the MNOS element 802 so that the element is erased. On the other hand, the MNOS elements 803, 806 and 808 are written and the elements 805 and 807 keep the erased states.

Under the normal use of the memory, $V_{cc}$ is returned to 5 V, M is grounded and $\overline{M}$ is set to be 5 V. Therefore, the MNOS elements 803, 806 and 808 are turned off and the elements 802, 805 and 807 are turned on, so that the word line 801 is rendered inactive and the spare word line 804 is conditioned into an active state. In other words, usual address MOS transistors 843 and 847 are replaced respectively by 815 and 817 of spare address MOS transistors 815 to 818 and the defective usual word line 801 is replaced by the spare word line 804.

Though the present invention has been shown and explained with reference to the preferred embodiments, it should be understood that the invention is not limited to those embodiments but covers a variety of other possible modifications.

For example, any types of nonvolatile semiconductor memory elements other than the FLOTOX, MNOS and FAMOS types may be used.

Though the substitution programming has been explained with respect to the case where the supply voltage applied to the supply voltage input pin $V_{cc}$ is raised to a high level, it will be easily understood that alternatively, special pins other than the $V_{cc}$ pins or special probing pads may be provided for the purpose of substitution programming.

Though explanation has been made about the circuits in which the invention is applied to word (or column select) lines, the invention is applicable to any select lines for switching bit line select transistors to substitute defective bit (or row select) lines, in the same manner as has been explained herein.

As has been explained, the present invention can provide a defect-remediable LSI memory and a spare substitution method in such a memory in which defects can be electrically remedied in a short time.

The present invention is most conveniently applicable to EPROM (Erasable Programmable Read Only Memory) and EEPROM (Electrically Erasable Programmable Read Only Memory) types of LSI memories because it causes no increase of the number of the fabrication steps the these types of memories, but the present invention may be effectively applied to other types of usual LSI memories.

We claim:

1. A semiconductor integrated circuit memory comprising a memory array having a plurality of usual memory cells arranged in a matrix form of columns and rows, usual column (or row) select lines for selecting the columns (or rows) of said memory array, address line means for inputting an address signal, and a usual address transistor circuit connected between said address line means and each of said usual column (or row) select lines for accessing a selected one of said usual column (or row) select lines in accordance with said address signal, wherein said memory further comprises:
   a plurality of spare memory cells provided in the form of at least one column (or row) in said memory array;
   a spare column (or row) select line for selecting the column (or row) of said spare memory cells;
   a spare address transistor circuit connected between said spare column (or row) select line and said address line means;
   a first converting circuit connected to said spare address transistor circuit and including first nonvolatile semiconductor memory element means, said first converting circuit being operable upon the written or erased state of said first nonvolatile memory element means for conditioning said spare address transistor circuit into an active state to allow access to said spare column (or row) select line; and
   a second converting circuit connected to said spare column (or row) select line and including second nonvolatile semiconductor memory element means, said second converting circuit being operable upon the written or erased state of said second nonvolatile memory element means for setting said spare column (or row) select line to the grounded state.

2. A semiconductor integrated circuit memory as set forth in claim 1, wherein first nonvolatile memory elements in said first nonvolatile memory element means of said first converting circuit are connected to respective selected terminals of spare address transistors in said spare address transistor circuit, said first converting circuit being operable upon the written or erased states of said first nonvolatile memory elements for grounding predetermined ones of the selected terminals of said spare address transistors.

3. A semiconductor integrated circuit memory as set forth in claim 1, further comprising writing means for said first and second nonvolatile memory element means.

4. A semiconductor integrated circuit memory as set forth in claim 3, further comprising erasing means for said first and second nonvolatile memory element means.

5. A semiconductor integrated circuit memory as set forth in any one of claims 1 to 4, further comprising a third converting circuit connected to each of said usual column (or row) select lines and including third nonvolatile semiconductor memory element means, said third converting circuit being operable upon the written or erased state of said third nonvolatile memory element means for grounding the associated usual column (or row) select line.

6. A semiconductor integrated circuit memory as set forth in claim 5, further comprising writing means for said third nonvolatile memory element means.

7. A semiconductor integrated circuit memory as set forth in claim 5, further comprising erasing means for said third nonvolatile memory element means.

8. A spare substitution method in a semiconductor integrated circuit memory comprising a memory array having a plurality of usual memory cells arranged in a matrix form of columns and rows, usual column (or row) select lines for selecting the columns (or rows) of said memory array, address line means for inputting an address signal, address transistors connected between said address lines means and each of said usual column (or row) select lines for accessing a selected one of said usual column (or row) select line in accordance with said address signal, a plurality of spare memory cells provided in the form of at least one column (or row) in said memory array, a spare column (or row) select line for selecting the column (or row) of said spare memory cells, spare address transistors connected between said spare column (or row) select line and said address line means, a first converting circuit connected to said spare address transistors and including first nonvolatile semiconductor memory element means, a second converting circuit connected to said spare column (or row) select line and including second nonvolatile semiconductor memory element means, and a third converting circuit connected to each of said usual column (or row) select lines and including third nonvolatile semiconductor memory element means, said method comprising the steps of:

rendering operative the third converting circuit connected to a defective one of said usual column (or row) select lines which includes a defective usual memory cell, by setting the third nonvolatile memory element means into the written or erased state, thereby to ground the defective usual column (or row) select line;

rendering operative the second converting circuit connected to said spare column (or row) select line, by setting the second nonvolatile memory elements into the written or erased state, thereby to release said spare column (or row) select line from its preliminarily grounded state; and rendering the first converting circuit operative by setting the first nonvolatile memory elements into the written or erased state, thereby to condition the spare address transistor corresponding to the usual address transistor of said defective usual column (or row) select line into an active state and to condition the other spare address transistor into an inactive state, whereby said spare column (or row) select line is substituted for said defective usual column (or row) select line.

9. A semiconductor integrated circuit memory comprising a memory array having a plurality of usual memory cells arranged in a matrix form of columns and rows, usual column (or row) select lines for selecting the columns (or rows) of said memory array, address line means for inputting an address signal, and a usual address transistor circuit connected between said address line means and each of said usual column (or row) select lines for accessing a selected one of said usual column (or row) select lines in accordance with said address signal, wherein said memory further comprises:

a plurality of spare memory cells provided in the form of at least one column (or row) in said memory array;

a spare column (or row) select line for selecting the column of said spare memory cells;

a spare address transistor circuit connected between said spare column (or row) select line and said address line means;

a first converting circuit connected to said spare address transistor circuit and including first nonvolatile semiconductor memory element means, said first converting circuit being operable upon the written or erased state of said first nonvolatile memory element means for conditioning said spare address transistor circuit into an active state to allow access to said spare column (or row) select line in response to a predetermined address when said spare column (or row) is to be substituted for a defective usual column (or row) select line having said predetermined address; and a second converting circuit connected to said spare column (or row) select line and including second nonvolatile semiconductor memory element means, said second converting circuit being operable upon the written or erased state of said second nonvolatile memory element means for setting said spare column (or row) selected line to the grounded state when said spare column (or row) select line is not substituted for a usual column (or row) select line.

10. A semiconductor integrated circuit memory as set forth in claim 9, further comprising a third converting circuit connected to each of said usual column (or row) select lines and including third nonvolatile semiconductor memory element means, said third converting circuit being operable upon the written or erased state of said third nonvolatile memory element means for grounding the associated usual column (or row) select line when said spare column (or row) select line is to be substituted for said associated usual column (or row) select line.

11. A semiconductor integrated circuit memory as set forth in claim 1, wherein said first and second nonvolatile semiconductor memory element means are comprised of FLOTOX elements which will be conductive when erased and which will be non-conductive when written.

12. A semiconductor integrated circuit memory as set forth in claim 5, wherein said first, second and third nonvolatile semiconductor memory element means are comprised of FLOTOX elements which will be conductive when erased and which will be non-conductive when written.

13. A spare substitution method in a semiconductor integrated circuit memory as set forth in claim 8, wherein said first and second nonvolatile semiconductor memory elements means are comprised of FLOTOX elements which will be conductive when erased and which will be non-conductive when written.

14. A semiconductor integrated circuit memory as set forth in claim 9, wherein said first and second nonvolatile semiconductor memory element means are comprised of FLOTOX elements which will be conductive when erased and which will be non-conductive when written.

15. A semiconductor integrated circuit memory as set forth in claim 10, wherein said first, second and third nonvolatile semiconductor memory element means are comprised of FLOTOX elements which will be conductive when erased and which will be non-conductive when written.

* * * * *